United States Patent
Na et al.

(10) Patent No.: US 8,350,613 B2
(45) Date of Patent: Jan. 8, 2013

(54) SIGNAL DELAY CIRCUIT, CLOCK TRANSFER CONTROL CIRCUIT AND SEMICONDUCTOR DEVICE HAVING THE SAME

(75) Inventors: Hyoung-Jun Na, Gyeonggi-do (KR); Kyung-Whan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/552,037

(22) Filed: Jul. 18, 2012

(65) Prior Publication Data
US 2012/0280737 A1    Nov. 8, 2012

Related U.S. Application Data

(62) Division of application No. 12/792,530, filed on Jun. 2, 2010, now Pat. No. 8,248,129.

(30) Foreign Application Priority Data

Jul. 10, 2009  (KR) .......................... 10-2009-0062920

(51) Int. Cl.
*G06F 1/04* (2006.01)

(52) U.S. Cl. ......................................... 327/291; 327/298
(58) Field of Classification Search .................. None
See application file for complete search history.

(56) References Cited

U.S. PATENT DOCUMENTS

| | | | | |
|---|---|---|---|---|
| 5,760,609 A * | 6/1998 | Sharpe-Geisler | ............... | 326/93 |
| 5,844,438 A * | 12/1998 | Lee | ................. | 327/291 |
| 5,939,919 A * | 8/1999 | Proebsting | .................... | 327/295 |
| 6,049,241 A * | 4/2000 | Brown et al. | ................. | 327/295 |
| 7,486,126 B2 * | 2/2009 | Shimazaki | .................... | 327/295 |
| 7,714,632 B2 * | 5/2010 | Cho | ............................. | 327/291 |
| 7,936,199 B2 * | 5/2011 | Ho et al. | ....................... | 327/298 |
| 7,990,197 B2 * | 8/2011 | Lee | ................................ | 327/263 |

* cited by examiner

*Primary Examiner* — Cassandra Cox
(74) *Attorney, Agent, or Firm* — IP & T Group LLP

(57) ABSTRACT

A signal delay circuit including a clock transfer control circuit configured to transmit or block a clock signal, and a pulse signal generation circuit configured to delay a first pulse signal in response to the transmitted clock signal to generate a second pulse signal which has a longer active period than the first pulse signal.

5 Claims, 6 Drawing Sheets

SIGNAL DELAY CIRCUIT, CLOCK TRANSFER CONTROL CIRCUIT AND SEMICONDUCTOR DEVICE HAVING THE SAME

CROSS-REFERENCE TO RELATED APPLICATIONS

This application is a division of U.S. patent application Ser. No. 12/792,530 filed on Jun. 2, 2010, now U.S. Pat. No. 8,248,129 which claims priority of Korean Patent Application No. 10-2009-0062920 filed on Jul. 10, 2009. The disclosure of each of the foregoing applications is incorporated herein by reference in its entirety.

BACKGROUND OF THE INVENTION

Exemplary embodiments of the present invention relate to a semiconductor design technology, and more particularly, to a technology for changing a width of a signal and controlling a transmission of a clock signal.

Semiconductor devices and Integrated Circuits (ICs) have been continuously improved to increase not only the degree of integration but also the operation speed. Many semiconductor devices and ICs operate in synchronization with a periodic pulse signal such as a clock signal, in order to increase the operation speed and perform an internal operation effectively. Therefore, such semiconductor devices and ICs operate in response to a clock signal supplied from outside or an internal clock signal generated therein.

FIG. 1 is a circuit diagram of a conventional semiconductor device.

Referring to FIG. 1, the conventional semiconductor device includes a delay unit 11 and a logic circuit 11_2.

The delay unit 11 is configured to delay a first pulse signal PULSE_IN in response to a clock signal CLK. The logic circuit 11_2 is configured to perform an OR operation on the first pulse signal PULSE_IN and a signal P_DLY outputted from the delay unit 11, and outputs a second pulse signal PULSE_OUT. Here, the second pulse signal PULSE_OUT becomes activated at an activation time of the first pulse signal PULSE_IN, and has a longer active period than the first pulse signal PULSE_IN.

Meanwhile, the delay unit 11 may include a plurality of D flip-flops which are enabled by a clock signal CLK, and the number of the D flip-flops corresponds to a delay value for delaying the first pulse signal PULSE_IN. At this time, since the clock signal CLK continuously toggles, the clock signal CLK may continue to consume current because transistors within the D flip-flops become continuously charged and discharged. Such current consumption may occur even while no signal is inputted to the D flip-flops, as well as even in a stand-by state.

FIG. 2 is a timing diagram illustrating the internal operation of the semiconductor device shown in FIG. 1.

Referring to FIG. 2, the operation of the semiconductor device shown in FIG. 1 may be described as follows.

The first pulse signal PULSE_IN is inputted to the delay unit 11, then the delay unit 11 delays the first pulse signal PULSE_IN to output a signal P_DLY in synchronization with the clock signal CLK. Then, the logic circuit 11_2 performs an OR operation on the first pulse signal PULSE_IN and the delayed signal P_DLY, and outputs a second pulse signal PULSE_OUT which has a longer active period than the first pulse signal PULSE_IN.

At this time, the clock signal CLK continuously toggles regardless of the input of the first pulse signal PULSE_IN. Therefore, as described above, the clock signal CLK continues to consume current because the transistors within the D flip-flops which constitute the delay unit 11 are continuously charged and discharged. Such current consumption may occur even while no signal is inputted to the D flip-flops. Therefore, it may be one of the factors which increase the current consumption regardless of the internal operation.

SUMMARY OF THE INVENTION

An embodiment of the present invention is directed to a signal delay circuit which may change a width of a signal, a semiconductor device therewith and a clock transfer control circuit.

In accordance with an embodiment of the present invention, a signal delay circuit includes: a clock transfer control circuit configured to output a clock signal; and a pulse signal generation circuit configured to delay a first pulse signal in response to the transmitted clock signal to generate a second pulse signal which has a longer active period than the first pulse signal.

In accordance with another embodiment of the present invention, a semiconductor device includes: a clock transfer control circuit configured to transmit or block a clock signal; a pulse signal generation circuit configured to delay a first pulse signal in response to the transmitted clock signal to generate a second pulse signal for a longer active period than the first pulse signal; and an on die termination (ODT) circuit configured to determine the ODT mode depending on the second pulse signal.

In accordance with yet another embodiment of the present invention, a clock transfer control circuit includes: a first control pulse generation unit configured to generate a first control pulse which pulses at a transition time when a deactivated first pulse signal transits to be activated; a second control pulse generation unit configured to generate a second control pulse which pulses at a transition time when an activated delayed first pulse signal transits to be deactivated; and a clock output unit configured to output a clock signal in response to the first control pulse and configured to end the clock signal transmission in response to the second control pulse.

DESCRIPTION OF SPECIFIC EMBODIMENTS

Figure 1:
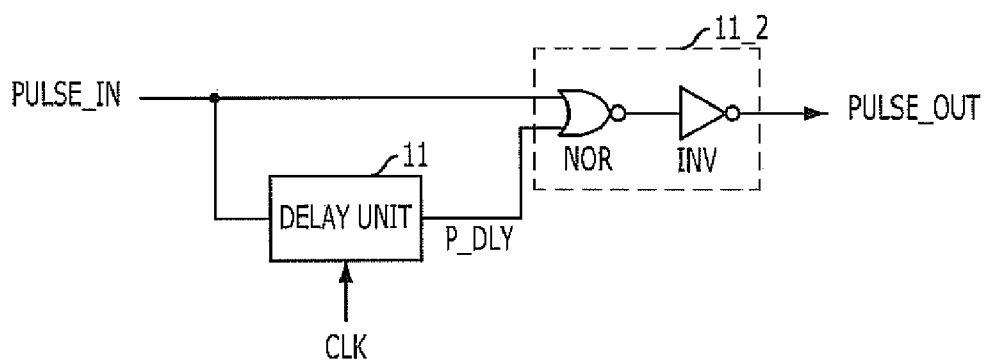
FIG. 1 is a configuration diagram of a conventional semiconductor device.
Figure 2:
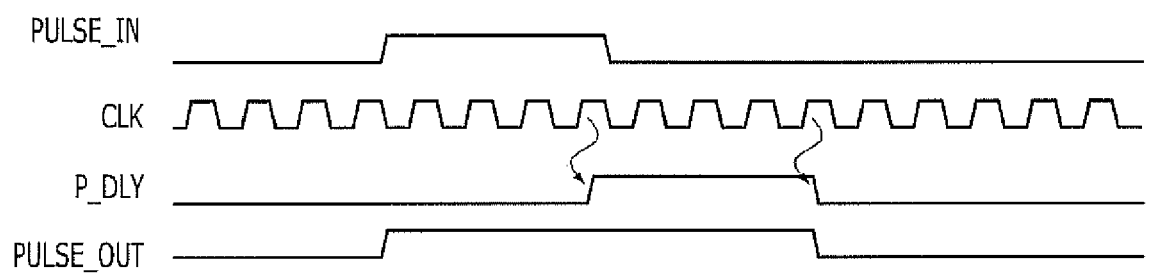
FIG. 2 is a timing diagram illustrating the internal operation of the semiconductor device shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In general, a logic signal and a binary data value of a circuit is divided into a high level H and a low level L in correspondence to a voltage level, and may be represented by '1' or '0'. Furthermore, it is defined that the logic signal and the binary data value may have a high impedance state Hi-Z and so on, if necessary.

Figure 3:
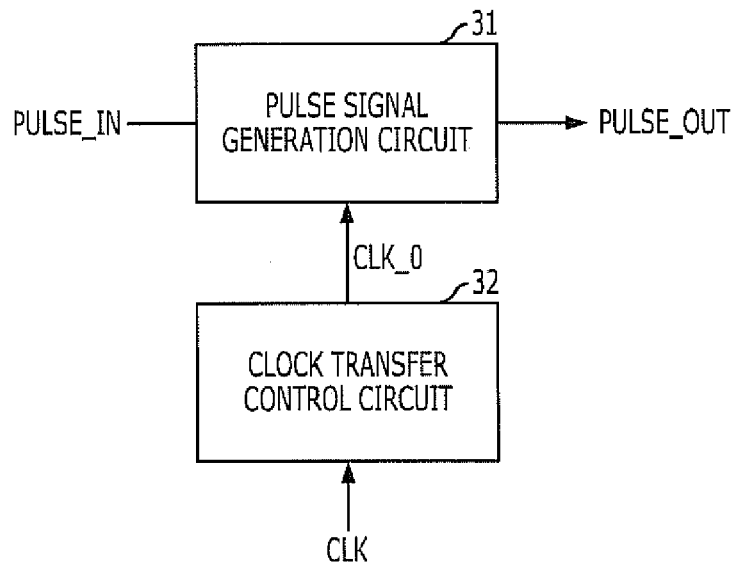
FIG. 3 is a configuration diagram of a signal delay circuit in accordance with an embodiment of this disclosure.

FIG. 3 is a configuration diagram of a signal delay circuit in accordance with an embodiment of this disclosure.

Referring to FIG. 3, the signal delay circuit includes a pulse signal generation circuit 31 and a clock transfer control circuit 32. The clock transfer control circuit 32 is configured to receive a clock signal CLK and output a clock signal CLK_0. The pulse signal generation circuit 31 is configured to delay a first pulse signal PULSE_IN in response to the transmitted clock signal CLK_0 to generate a second pulse signal PULSE_OUT which has a longer active period than the first pulse signal.

Figure 4:
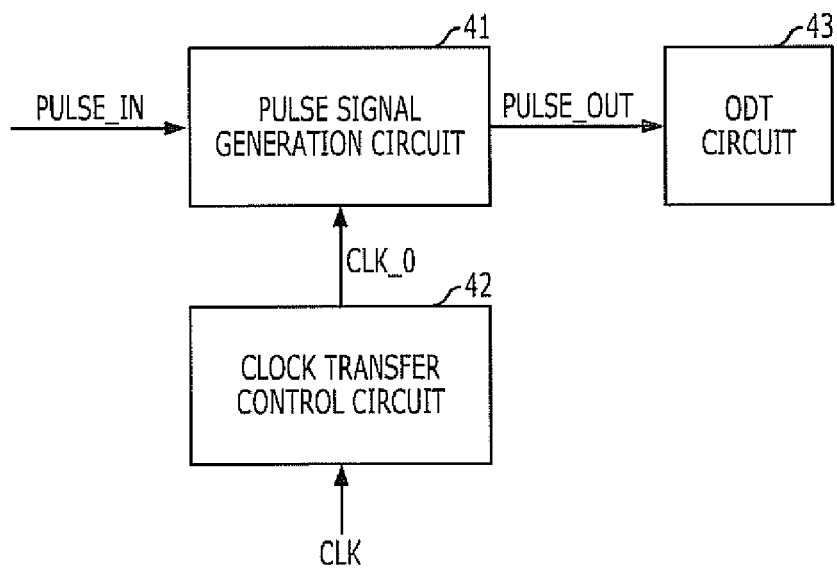
FIG. 4 is a configuration diagram of a semiconductor device in accordance with an embodiment of this disclosure.

FIG. 4 is a configuration diagram of a semiconductor device in accordance with an embodiment of this disclosure.

Referring to FIG. 4, the semiconductor device includes a pulse signal generation circuit 41, a clock transfer control circuit 42 and a on die termination (ODT) circuit 43. The clock transfer control circuit 42 is configured to transmit or block a clock signal CLK. The pulse signal generation circuit 41 is configured to delay a first pulse signal PULSE_IN in response to the transmitted clock signal CLK_0 to generate a second pulse signal PULSE_OUT which has a longer active period than the first pulse signal PULSE_IN. The on die termination (ODT) circuit 43 is configured to determine the ODT mode depending on the second pulse signal PULSE_OUT.

Figure 5:
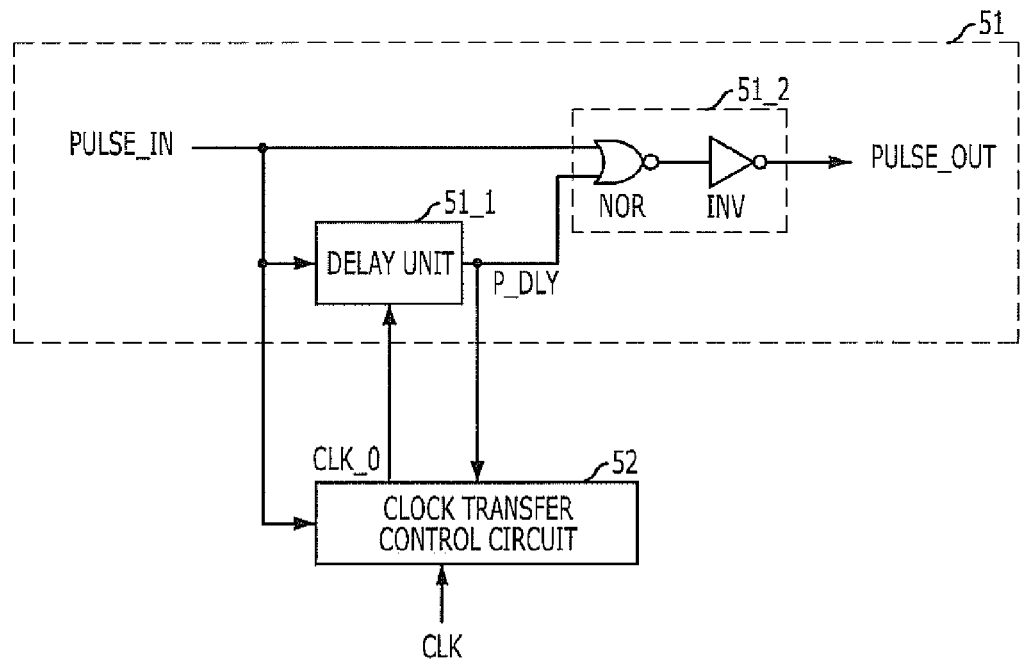
FIG. 5 is another configuration diagram of a semiconductor device in accordance with an embodiment of this disclosure.

FIG. 5 is a configuration diagram of a semiconductor device in accordance with an embodiment of this disclosure.

Referring to FIG. 5, the semiconductor device includes a pulse signal generation circuit 51 and a clock transfer control circuit 52. The pulse signal generation circuit 51 is configured to delay a first pulse signal PULSE_IN in response to a clock signal CLK_0 and generate a second pulse signal PULSE_OUT which has a longer active period than the first pulse signal PULSE_IN. The second pulse signal PULSE_OUT is activated at an activation time of the first pulse signal PULSE_IN. The clock transfer control circuit 52 is configured to transmit the clock signal CLK_0 to the pulse signal generation circuit 51 from the activation time of the first pulse signal PLUSE_IN to a deactivation time of the signal P_DLY obtained by delaying the first pulse signal PULSE_IN.

The detailed configuration and main operation of the semiconductor device may be described as follows.

The pulse signal generation circuit 51 includes a delay unit 51_1 and a logic circuit 51_2. The delay unit 51_1 is configured to delay the first pulse signal PULSE_IN in response to the clock signal CLK_0. The delay unit 51_1 includes a plurality of D flip-flops which are enabled by the clock signal CLK_0, and the number of D flip-flops corresponds to a delay value for delaying the first pulse signal PULSE_IN. The logic circuit 51_2 is configured to perform an OR operation on the first pulse signal PULSE_IN and the pulse signal P_DLY outputted by the delay unit 51_1 and generates the second pulse signal PULSE_OUT. The logic circuit 51_2 includes a NOR gate NOR and an inverter INV.

Meanwhile, the clock transfer control circuit 52 receives an input clock CLK to provide the clock signal CLK_0 to the delay unit 51_1 of the pulse signal generation circuit 51. The clock transfer control circuit 52 provides the clock signal CLK_0 which toggles, for example, only when the second pulse signal PULSE_OUT is activated.

Figure 6:
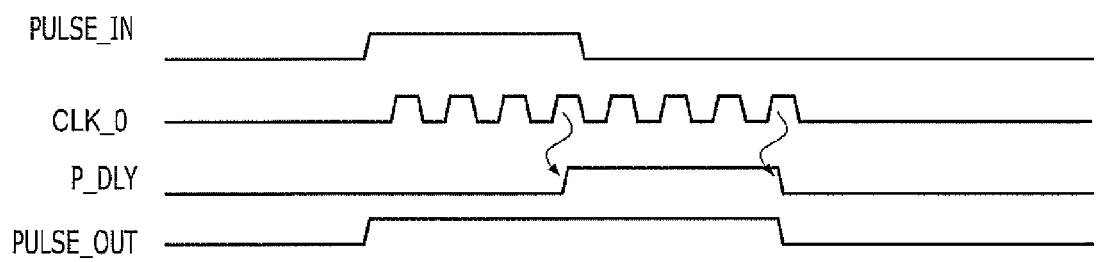
FIG. 6 is a timing diagram illustrating the internal operation of the semiconductor device shown in FIG. 5.

FIG. 6 is a timing diagram illustrating the internal operation of the semiconductor device of FIG. 5.

Referring to FIG. 6, the internal operation of the semiconductor device may be described as follows.

When the first pulse signal PULSE_IN is inputted to the delay unit 51_1, the delay unit 51_1 outputs the signal P_DLY which is output by delaying the first pulse signal PULSE_IN in synchronization with the clock signal CLK_0. Then, the logic circuit 51_2 performs an OR operation on the first pulse signal PULSE_IN and the delayed signal P_DLY, and outputs the second pulse signal PULSE_OUT which has a long active period than the first pulse signal PULSE_IN.

Meanwhile, the clock signal CLK_0 provided to the delay unit 51_1 of the pulse signal generation circuit 51 through the clock transfer control circuit 52 toggles, for example, only in a period in which the first pulse signal PULSE_IN is activated or the delayed signal P_DLY is activated. That is, since the clock signal CLK_0 toggles, for example, only in a required period, current consumption may be reduced.

For reference, there are two operation modes of an On-Die Termination (ODT) of semiconductor device. One is synchronous mode and the other is asynchronous mode. Herein, the first pulse signal PLUSE_IN may be used to change the mode for ODT. However, when the semiconductor device changes from an ODT asynchronous mode to an ODT synchronous mode, or from the ODT synchronous mode to the ODT asynchronous mode, a preparation time for transition is required. Therefore, the second pulse signal PULSE_OUT may be used as the ODT mode determination signal in this embodiment of the present invention. Also, in this case, current consumption may be reduced by using the clock signal CLK_0 which toggles, for example, only in a required period, as a clock for enabling a pulse signal (ODT mode determination signal) generation circuit.

Figure 7:
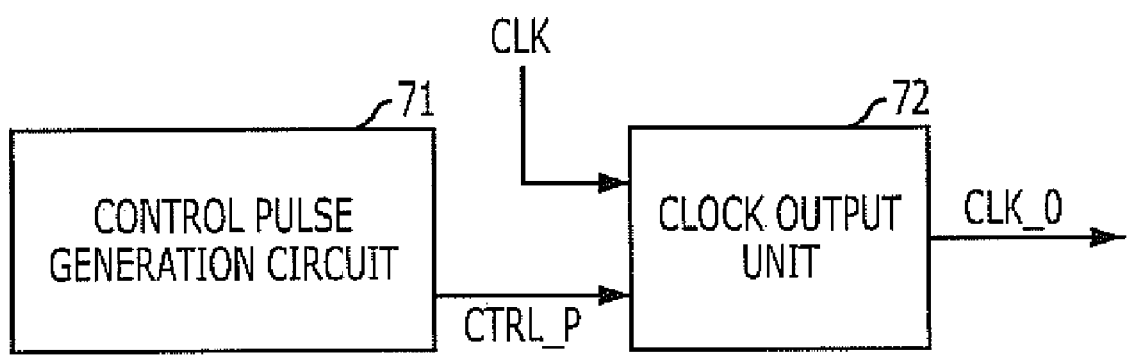
FIG. 7 is a configuration diagram of a clock transfer control circuit in accordance with an embodiment of this disclosure.

FIG. 7 is a configuration diagram of a clock transfer control circuit in accordance with an embodiment of this disclosure.

Referring to FIG. 7, the clock transfer control circuit includes a control pulse generation unit 71 and a clock output unit 72. The control pulse generation unit is configured to generate a control pulse CTRL_P, and the clock output unit is configured to transmit or block a clock signal CLK depending on the control pulse and to output a clock signal CLK_0.

Figure 8:
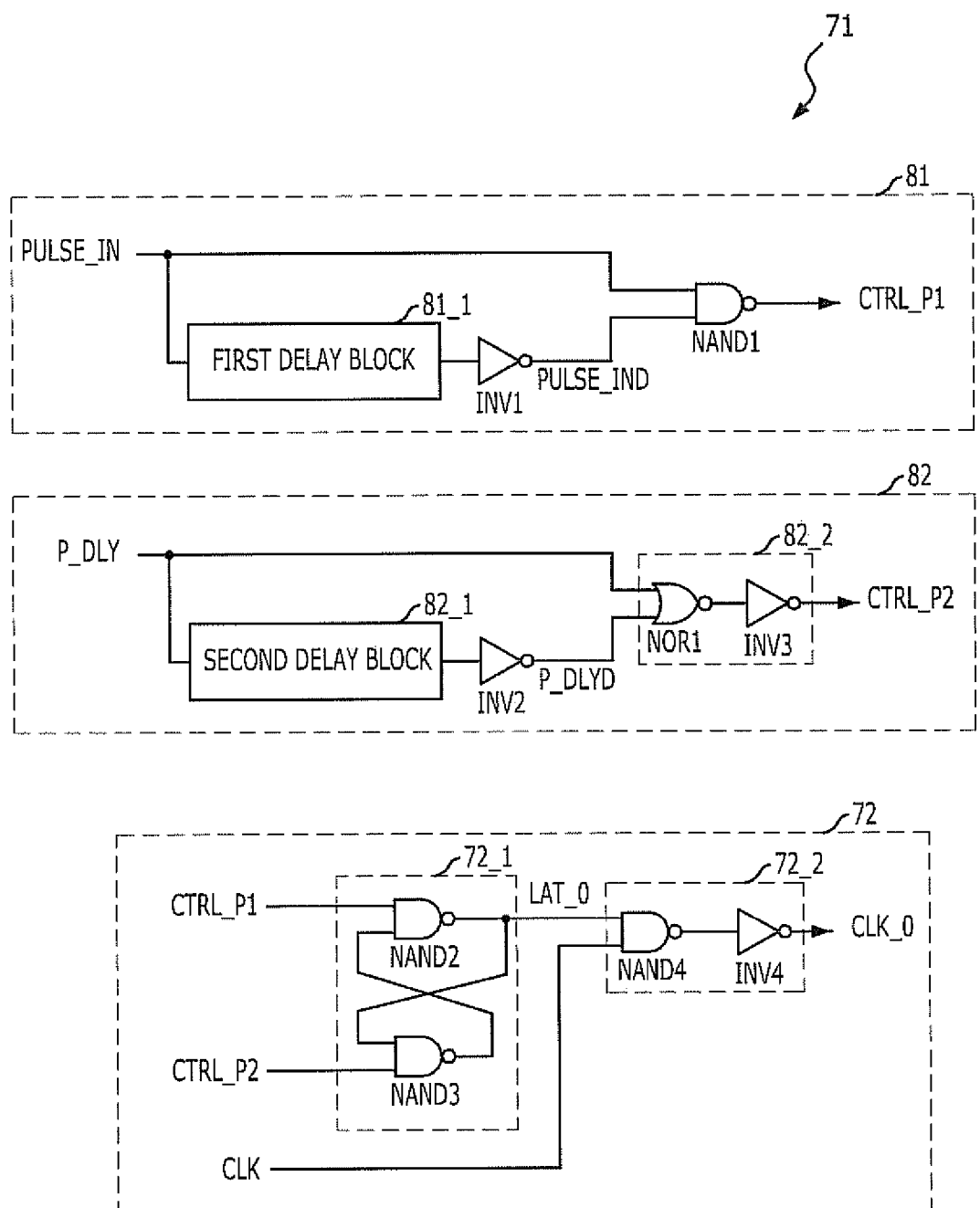
FIG. 8 is a circuit diagram of a clock transfer control circuit in accordance with an embodiment of this disclosure.

FIG. 8 is a configuration diagram of a clock transfer control circuit in accordance with the embodiment of this disclosure.

The clock transfer control circuit 71 may include a first control pulse generation unit 81, a second control pulse generation unit 82 and a clock output unit 72. The first control pulse generation unit is configured to generate a first control pulse in response to a first pulse signal, and the second control pulse generation unit is configured to generate a second control pulse in response to a delayed first pulse signal. For example, the first control pulse generation unit 81 is configured to generate a first control pulse CTRL_P1 which pulses for a preset time from the activation time of the first pulse signal PULSE_IN, and the second control pulse generation unit 82 is configured to generate a second control pulse CTRL_P2 which pulses for a preset time from the deactivation time of the signal obtained by delaying the first pulse signal PULSE_IN. The clock output unit 72 is configured to output a clock signal CLK_0 in response to the first control pulse CTRL_P1 and the second control pulse CTRL_P2. For example, the clock output unit 72 is configured to receive the input clock signal CLK, and outputs the clock signal CLK_0 from an activation time of the first control pulse CTRL_P1 to an activation time of the second control pulse CTRL_P2.

The first control pulse generation unit 81 may include a first delay block 81_1, a first inverter INV1 and a first logic circuit NAND1. The first delay block is configured to receive the first pulse signal PULSE_IN. The first inverter INV1 is configured to invert a signal outputted from the first delay block 81_1. The first logic circuit NAND1 is configured to perform a NAND operation on the first pulse signal PULSE_IN and a signal PULSE_IND outputted from the first invert INV1, and to output the first control pulse CTRL_P1. The first logic circuit NAND1 may be implemented as a NAND gate.

The second control pulse generation unit 82 may include a second delay block 82_1, a second inverter INV2 and a second logic circuit 82_2. The second delay block 82_1 is configured to receive the signal P_DLY obtained by delaying the first pulse signal PULSE_IN. The second inverter INV2 is configured to invert a signal outputted from the second delay block 82_1. The second logic circuit 82_2 is configured to perform an OR operation on the signal P_DLY obtained by delaying the first pulse signal PULSE_IN and the signal P_DLYD outputted by the second inverter INV2, and generates the second control pulse CTRL_P2. The second logic circuit 82_2 may include a NOR gate NOR1 and a third inverter INV3.

The clock output unit 72 may include an RS latch block 72_1 and a third logic circuit 72_2. The RS latch block 72_1 may include a second NAND gate NAND2 and a third NAND gate NAND3, and is configured to receive the first and second control pulses CTRL_P1 and CTRL_P2. The third logic circuit 72_2 is configured to perform an AND operation on the input clock signal CLK and a signal LAT_0 outputted from the RS latch block 72_1, and to output the clock signal CLK_0. The third logic circuit 72_2 may include a fourth NAND gate NAND4 and a fourth inverter INV4.

Figure 9:
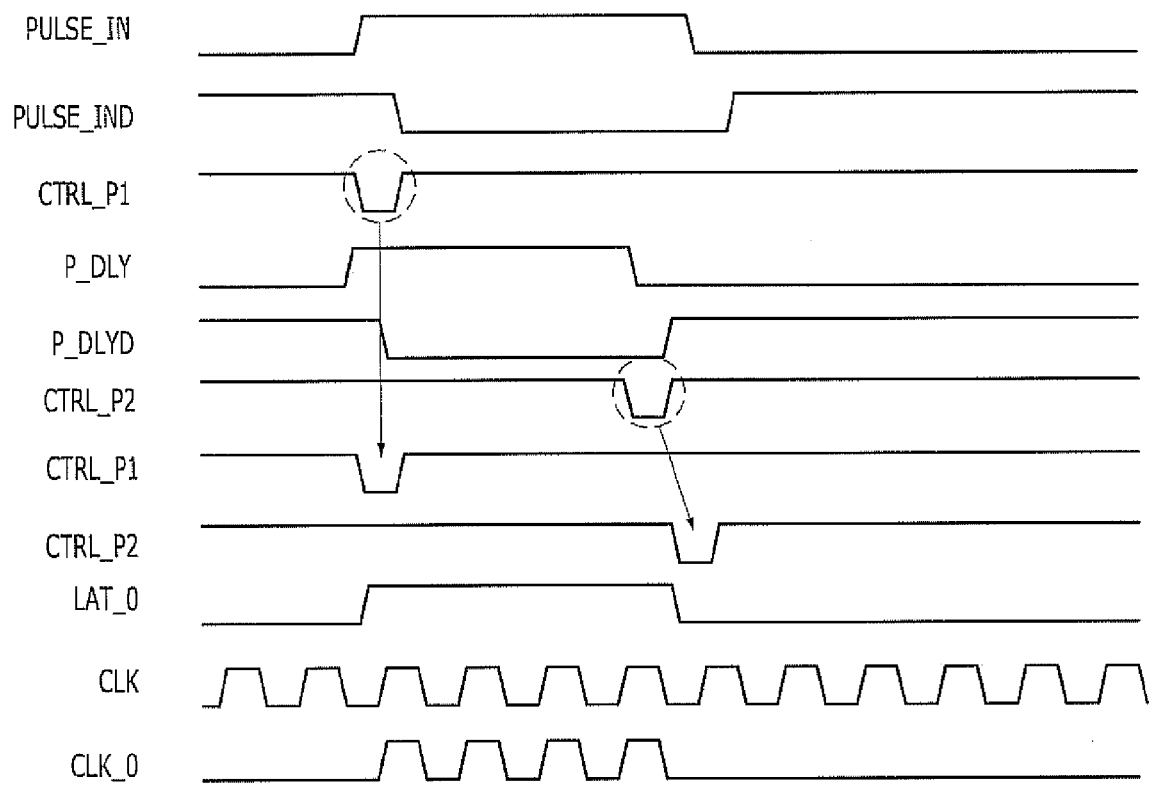
FIG. 9 is a timing diagram illustrating the internal operation of the clock transfer control circuit shown in FIG. 8.

FIG. 9 is a timing diagram illustrating the internal operation of the clock transfer control circuit shown in FIG. 8.

As shown in FIG. 9, the internal operation of the clock transfer control circuit will be described as follows.

First, the internal operation of the first control pulse generation unit 81 may be performed as follows.

The first pulse signal PULSE_IN is delayed by the first delay block 81_1 and then inverted by the first inverter INV1 to generate the signal PULSE_IND. Then, when the first logic circuit NAND1 performs on a NAND operation on the signal PULSE_IND and the first pulse signal PULSE_IN, the first control pulse CTRL_P1 which pulses to a low level for a preset period from the activation time of the first pulse signal PULSE_IN.

Next, the internal operation of the second control pulse generation unit 82 may be performed as follows.

The signal P_DLY obtained by delaying the first pulse signal PULSE_IN is delayed by the second delay block 82_1 and then inverted by the second inverter INV2 to generate the signal P_DLYD. Then, when the second logic circuit 82_2 performs an OR operation on the signal P_DLYD and the signal P_DLY, the second control pulse CTRL_P2 which pulses to a low level for a preset period from the deactivation time of the signal P_DLY is generated.

The internal operation of the clock output unit 72 is performed as follows.

The clock output unit 72 receives the input clock CLK. At this time, when the first control pulse CTRL_P1 is activated, the clock output unit 72 outputs the toggling clock signal CLK_0. When the second control pulse CTRL_P2 is activated, the clock output unit 72 does not output the clock signal CLK_0. That is, the clock output unit 72 outputs the clock signal CLK_0 which toggles from the activation time of the first control pulse CTRL_P1 to the activation time of the second control pulse CTRL_P2. Therefore, since the clock signal CLK_0 toggles, for example, only in a required period, the current consumption may be reduced.

While the present invention has been described with respect to the specific embodiments, it will be apparent to those skilled in the art that various changes and modifications may be made without departing from the spirit and scope of the invention as defined in the following claims.

For example, an embodiment including an additional component to describe the present invention in more detail may be disclosed, although the component does not have direct relation with the technical spirit of the present invention. Furthermore, the configuration of active high or active low for indicating an activation state of signal or circuit may differ depending on embodiments. Furthermore, to implement the same function, the configuration of transistors may be changed, if necessary. In other words, PMOS transistors and NMOS transistors may substitute each other, and various types of transistors may be used, if necessary. Furthermore, if necessary, the configuration of logic gates may be modified in order to implement the same function. That is, NAND unit or NOR unit may be implemented by various combinations of NAND gate, NOR gate, and inverter. Such a circuit change may have a large number of cases, and may be easily made by those skilled in the art. Therefore, the enumeration thereof will be omitted.

What is claimed is:

1. A clock transfer control circuit comprising:
   a first control pulse generation unit configured to generate a first control pulse which pulses at a transition time when a deactivated first pulse signal transits to be activated;
   a second control pulse generation unit configured to generate a second control pulse which pulses at a transition time when an activated delayed first pulse signal transits to be deactivated; and
   a clock output unit configured to output a clock signal in response to the first control pulse and configured to end the clock signal transmission in response to the second control pulse.

2. The clock transfer control circuit of claim 1, wherein the first control pulse generation unit comprises:
   a first delay block configured to receive the first pulse signal;
   a first inverter configured to invert a signal outputted from the first delay block; and
   a first logic circuit configured to perform a NAND operation on the first pulse signal and a signal outputted from the first inverter and to output the first control pulse.

3. The clock transfer control circuit of claim 2, wherein the second control pulse generation unit comprises:
   a second delay block configured to receive the delayed first pulse signal;
   a second inverter configured to invert a signal outputted from the second delay block; and a second logic circuit configured to perform an OR operation on the delayed first pulse signal and a signal outputted from the second inverter and to output the second control pulse.

4. The clock transfer control circuit of claim 1, wherein the clock output unit comprises:

an RS latch block configured to receive the first control pulse and the second control pulse; and a logic circuit configured to output the clock signal in response to a signal outputted from the RS latch block.

5. The clock transfer control circuit of claim 4, wherein the logic circuit is configured to perform an AND operation on the clock signal and a signal outputted from the RS latch.

* * * * *